United States Patent [19]
Hoffmann et al.

[11] Patent Number: 5,461,091
[45] Date of Patent: Oct. 24, 1995

[54] HEAT CURABLE CATHODIC ELECTROCOATING COMPOSITION

[75] Inventors: Gerhard Hoffmann, Otterstadt; Dieter Faul, Bad Durkheim; Klaus Huemke, Friedelsheim, all of Germany; John A. Gilbert, Beverly Hills, Mich.

[73] Assignee: BASF Aktiengesellschaft, Ludwigshafen, Germany

[21] Appl. No.: 303,881

[22] Filed: Sep. 9, 1994

Related U.S. Application Data

[63] Continuation of Ser. No. 209,359, Mar. 11, 1994, abandoned, which is a continuation of Ser. No. 93,995, Jul. 21, 1993, abandoned, which is a continuation of Ser. No. 962,886, Oct. 19, 1992, abandoned.

[30] Foreign Application Priority Data

Oct. 17, 1991 [DE] Germany .......................... 41 34 302.6

[51] Int. Cl.⁶ .................. C08K 3/20; C08L 63/02
[52] U.S. Cl. .................. 523/415; 204/181.4; 204/181.7; 524/901; 525/329.4; 525/459
[58] Field of Search .................. 525/415, 459, 525/329.4; 523/415; 204/181.4, 181.7; 524/901

[56] References Cited

U.S. PATENT DOCUMENTS

| | | | |
|---|---|---|---|
| 4,296,010 | 10/1981 | Tominaga . | |
| 4,504,606 | 3/1985 | Kordomenos | 523/400 |
| 4,602,070 | 7/1986 | Cavitt et al. | 525/528 |
| 5,096,555 | 3/1992 | Schupp et al. | 204/181.7 |
| 5,114,552 | 5/1992 | McCollum et al. | 523/404 |

FOREIGN PATENT DOCUMENTS

| | | |
|---|---|---|
| 59-093038 | 5/1984 | Japan . |
| WO87/04448 | 7/1987 | WIPO . |

OTHER PUBLICATIONS

English abstract of JP 59-093038, May 1984.
Process in Organic Coatings, vol. 9, pp. 3-28, 1981, Z. W. Wicks, Jr., "New Developments in The Field of Blocked Isocyanates".

*Primary Examiner*—Melvyn I. Marquis
*Assistant Examiner*—D. Aylward
*Attorney, Agent, or Firm*—Keil & Weinkauf

[57] ABSTRACT

A heat curable coating composition, particular for cathodic electrocoating, comprises
(A) from 50 to 95% by weight of a chain or step growth polymerization product having functional groups and
(B) from 50 to 5% by weight of a mixture of polymethylenepolyphenyl isocyanates which contains less than 25% of diphenylmethane diisocyanates.

12 Claims, No Drawings

HEAT CURABLE CATHODIC ELECTROCOATING COMPOSITION

This application is a continuation of application Ser. No. 08/209,359, filed on Mar. 11, 1994, abandoned, which is continuation of application Ser. No. 08/093,995, filed Jul. 21, 1993, abandoned, which is a continuation of Ser. No. 07/962,826, filed on Oct. 19, 1992, abandoned.

The present invention relates to a heat curable coating composition for cathodic electrocoating which is water thinnable on protonation with an acid and contains a chain or step growth polymerization product as binder and a mixture of blocked polymethylenepolyphenyl isocyanates as crosslinking agent.

Polymeric binders with free OH and/or free NH groups can be crosslinked with isocyanato-containing components at above 100° C. Since isocyanate groups react even at low temperatures, they are usually blocked with reactive, low molecular weight compounds. The blocking agent used can be any kind of compound containing OH, NH or acidic CH (see Progress Org. Coatings 9 (1981), 3–28).

At higher temperatures the reaction products re-eliminate the isocyanate groups; the isocyanate groups can then react with OH- and NH-containing binders with crosslinking. The equilibrium shifts toward crosslinking (transurethanization) as a result of the evaporation of he low molecular weight blocking component.

To make it possible for polyisocyanates to be handled safely, a small increase in the molecular weight is produced in a preliminary stage. For instance, a diisocyanate can be reacted in a first stage with a triol; this produces under suitable reaction conditions a trimerized isocyanate having a distinctly lower vapor pressure and reduced skin absorption and also a favorable crosslinking trifunctionality. However, this preliminary reaction of the diisocyanate makes industrial production of electrocoatings costly.

U.S. Pat. No. 4,296,010 describes coating compositions comprising a binder and a crosslinking agent based on diphenylmethane 4,4'-diisocyanate (MDI) or a mixture of about 50% each of diphenylmethane 4,4'-diisocyanate and polymethylenepolyphenyl isocyanate (crude MDI). It is true that such coating compositions produce nonyellowing coatings, but their storage life is not satisfactory in that the dispersion of the coating composition will gradually form a sediment. According to EP-A-236 050, this problem disappears on using as crosslinker a blocked polymethylenepolyphenyl isocyanate containing more than 5% of diphenylmethane 2,4-diisocyanate. The isocyanate mixture can contain up to 75%, preferably 10–50%, of polyisocyanates with three or more rings. It has now been found that such electrocoating compositions likewise give rise to sediments in the bath.

It is an object of the present invention to provide crosslinkers for cathodic electrocoating which

- have a high content of aromatic structures in order to ensure good corrosion protection,
- despite the aromatic structures do not cause white topcoats to yellow,
- deblock at a low baking temperature and then exhibit high reactivity,
- despite the low deblocking temperature form stable formulations or electrocoating baths,
- have no crystallization tendency in order that gelling and sedimentation may be effectively sup pressed, and
- are simple and inexpensive to produce from in expensive, commercially available raw materials.

We have found that this object is achieved when the crosslinker is a mixture of blocked polymethylenepolyphenylisocyanates which contains less than 25% by weight of diphenylmethane diisocyanates.

The present invention accordingly provides a heat curable coating composition for cathodic electrocoating, water thinnable on protonation with an acid, comprising (A) from 50 to 95% by weight of a chain or step growth polymerization product having functional groups and (B) from 50 to 5% by weight of a blocked polymethylenepolyphenyl isocyanate as crosslinker, wherein the crosslinker comprises a mixture of blocked polyisocyanates of the formula

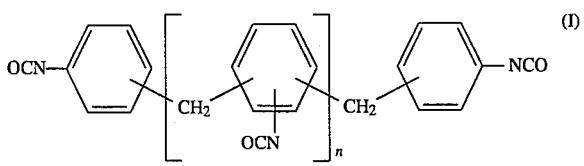

where n is from 0 to 10, but contains less than 25% of diphenylmethane diisocyanates where n=0.

Preferably, the polyisocyanate mixture according to the present invention contains from 5 to 20%, in particular from 12 to 18%, of diphenylmethane diisocyanates, the diphenylmethane 2,4'-diisocyanate content preferably being less than 5%, in particular less than 2%. The viscosity of the polyisocyanate mixture at 35° C. is preferably from 2,500 to 8,000, in particular from 3,500 to 6,000 mPa.s.

The polyisocyanate mixture with less than 25% of diphenylmethane diisocyanates can be prepared by a distillation of crude MDI in which preferably the diphenylmethane 4,4'-diisocyanate is distilled off and the higher molecular weight portions are concentrated. The diphenylmethane diisocyanate content of the isocyanate mixture can be determined in a conventional manner, for example by column chromatography or by HPLC.

The polyisocyanate mixture according to the present invention is polyfunctional even without trimerization; that is, correctly put together, the mixture will have a functionality of greater than 3.0. Consequently, the preliminary trimerization can be dispensed with; this reduces production costs.

The polyisocyanates of the structure (I) react with any blocking component known to those skilled in the art, so that a wide range of different crosslinkers can be synthesized. For instance, using alcohols it is possible to prepare crosslinkers having deblocking temperatures of around 160° C; amines will give blocked crosslinkers for a baking temperature of around 130° C.

The polyisocyanates are liquid even at low temperatures and have no tendency to crystallize. Similarly, the reaction products with the blocking components are stable and make it possible to formulate nongelling coatings and stable electrocoating baths.

Even at high baking temperatures the crosslinkers do not cause white topcoats to yellow.

The crosslinkers require distinctly less solvent in their synthesis than the prior art. Consequently the solvent content of the coating compositions formulated therewith can be reduced.

By partial blocking with tertiary amines and subsequent quaternization thereof it is possible to produce crosslinker dispersions of high stability.

In the electrocoating bath, the polyisocyanates are present in the blocked state. They are blocked by reacting the polyisocyante mixture with a stoichiometric amount of blocking agent corresponding to the isocyanate content. Depending on the blocking component the reaction temperatures range from 20° to 60° C. The reaction times range from two to three hours until a residual isocyanate value of 0 is reached.

The reaction can be carried out using a certain amount of solvent depending on the type of blocking agent; it is an advantage to use no solvent at all. It is advisable to add small amounts of a low molecular weight alcohol toward the end of the reaction.

Suitable blocking agents are:

alcohols: primary, secondary or tertiary; preferably alkylene glycol monoethers or polyalkylene glycol monoethers;

amines: primary and secondary; α,ω-diamines with disubstitution on one of the nitrogens; alkoxyamines; trishydroxyalkylamines; preferably aliphatic amines;

oximes;

hydroxyimides;

heterocyclic compounds such as triazoles, imidazoles, imidazolines, and so on;

lactams;

phenols;

active methylene derivatives such as ethyl acetate, malonic acid, enamines;

Particular preference is given to:

ethylene glycol monopropyl ether (PG), diethylene glycol monobutyl ether (BDG), diethylene glycol monohexyl ether, triethylene glycol monomethyl ether, dipropylene glycol monoisopropyl ether, dibutylamine, diallylamine, N-ethyl-N-phenylamine, di[2-methoxyethyl]amine, N,N-dimethyl-1,3-propylenediamine, methylethanolamine, diethanolamine, methyl ethyl ketoxime, 3,4-dimethylphenol.

As component (A) it is possible to use synthetic resin binders known in the art with primary and/or secondary hydroxyl groups and/or primary, secondary and/or tertiary amino groups, preferably with an average molecular weight $M_n$ of from 500 to 20,000, such as amino-epoxy resins, amino-poly(meth)acrylate resins and/or amino-polyurethane resins with an amine number of from 30 to 150. The use of amino-epoxy resins is preferred for basecoats which are to give a high corrosion protection level. The synthetic resin binder contains at least one amino group per molecule. The lower limit for the amine number should be 45, preferably 70, and the upper limit should be 120, preferably 100. Examples of amino-epoxy resins are reaction products of epoxy-containing resins with preferably terminal epoxy groups with saturated and/or unsaturated secondary and/or primary amines or amino alcohols. These reaction products may be modified at the alkyl moiety by at least one primary and/or secondary hydroxyl group, by the mono- or dialkylamino group and/or by a primary amino group temporarily protected by ketiminization.

As epoxy resins it is possible to use any desired material, provided it has an average molecular weight of from 300 to 60,000 and contains on average from 1.0 to 3.0 epoxy groups per molecule, preferably compounds having two epoxy groups per molecule. Preference is given to epoxy resins having average molecular weights of from 350 to 5,000, in particular from 350 to 2,000. Particularly preferred epoxy resins are for example glycidyl ethers of polyphenols containing on average at least two phenolic hydroxyl groups in the molecule and preparable in a conventional manner by etherification with an epihalohydrin in the presence of alkali. Aromatic polyepoxides having a high epoxy equivalent weight can be prepared from those having lower epoxy equivalent weight and polyphenols.

The introduction of amino groups can be effected in one of the usual reactions as known to the person skilled in the art and as described for example in EP 134 983, EP 165 556 or EP 166 314.

As well as the abovementioned components it is possible for further substances to be added such as pigments, coating assistants, solvents and hardener catalysts. The coating compositions thus prepared can be applied to substrates such as wood, plastic or metal in a conventional manner. For cathodic electrocoating, the synthetic resin is converted into a water-soluble form, together with the additives mentioned, by protonation with an acid. Preferred acids are carboxylic acids such as formic acid, acetic acid or lactic acid, but it is also possible to use organic acids, for example phosphoric acid. Subsequently this dispersion is admixed with a dispersion of the crosslinker in the desired ratio. It is of course also possible to add the additives mentioned to the crosslinker and then to disperse the mixture.

A cathodic electrocoating bath is in general adjusted to a solids content of from 5 to 30% by weight.

Deposition customarily takes place at from 15° to 40° C. in the course of from 0.5 to 5 min and at a pH within the range of from 4.0 to 8.5, preferably at a neutral pH, and at a voltage of from 50 to 500 V. The electrically conducting object to be coated is connected as the cathode at the time. After a rinse, the deposited film is cured at above 100° C. (object temperature) for 20 min.

EXAMPLES

Preparation of binder dispersion A 1805 g of a liquid epoxy resin having an epoxy equivalent weight of 188 are mixed in a 5-l stirred flask with 450 g of p-nonylphenol, 63 g of xylene and 7 g of dimethylbenzylamine and heated to 130° C. When an epoxy equivalent weight of 460 has been reached, 440 g of xylene are added; then the mixture is cooled down to 80° C. A mixture of 126 g of diethanolamine and 90 g of N-methylethanolamine are added dropwise. After stirring for one hour at 80° C. a further 73 g of ethanolamine are added dropwise. After two hours' stirring at 80° C. the mixture is diluted with 127 g of hexylglycol. The solids content is 80% and the molecular weight $M_n$ is 3025 (measured by gel permeation chromatography) coupled with a polydispersity of 1.65.

Preparation of crosslinker dispersion B

A polyisocyanate mixture is used comprising 14.9% of diphenylmethane 4,4'-diisocyanate, 1.0% of diphenylmethane 2,4'-diisocyanate, and 84.1% of tricyclic or higher polyisocyanates having a viscosity at 25° C. of 7070 mPa.s and an isocyanate value of 30.6%. 343 g of this polyisocyanate mixture are dissolved in 169 g of methyl ethyl ketone. 332.5 g of di(2-methoxyethyl)amine are added at room temperature in the course of half an hour. The temperature rises all the while to 56° C. After 20 minutes' stirring 195 g of isobutanol are metered in; the mixture is then cooled down. The solids content is 63.1%. The 55% solution in 1-methoxy-2-propanol (Solvenon PM) has a viscosity of 102 mPa.s at 25° C.

Preparation of pigment paste 660.8 g of epoxy resin EPON 828 (from SHELL), 260.6 g of bisphenol A and 61.5 g of dodecylphenol are mixed and heated to 110° C. until a clear solution has formed. Then 0.98 g of ethyltriphenylphosphonium iodide is added, whereupon the temperature rises to 150° C. After the exothermic reaction has died down, the mixture is maintained at 130° C. for 90 min. It is then diluted with 513.5 g of 2-butoxyethanol and cooled to 80° C., at which point 244.2 g of thiodiethanol (50% active) are added dropwise in the course of 30 min. Then 134.1 g of dimethylolpropionic acid and 30.6 g of water are added. 98 g of this resin are made into a paste with 175 g of titanium dioxide, 8 g of lead silicate, 35 g of aluminum silicate, 11 g of dibutyltin oxide, 3.5 g of pearl black and 169.5 g of water.

Preparation of electrocoating bath:

508.2 g of binder A are mixed with 68 g of polypropylene glycol phenyl ether and 273.6 g of cross-linker B, and then 15 g of glacial acetic acid and 593 g of water are added. 590 g of this water-solvent mixture are distilled off under reduced pressure at 45° C. while at the same time a further 975 g of water are added. The result is an aqueous secondary dispersion having a solids content of 30%. The bath has a storage life of more than 6 weeks; no separation or crystallization occurs.

Electrocoating

The bath described is used for coating a phosphatized steel panel. The deposition voltage is 360 volts and the tear-off voltage is 380 volts. The result is a 22.5 μm thick film which can be baked at 140° C. to form a coating which is free of any yellowing.

We claim:

1. An aqueous cathodic electrocoating bath wherein the coating resulting from said bath is heat curable comprising
   (A) from 50 to 95% by weight of a protonated chain or step growth polymerization product having functional groups reactive with isocyanate groups and
   (B) from 50 to 5% by weight of a blocked polyisocyanate as crosslinker,
   wherein the polyisocyanate comprises a mixture of polyisocyanates of the formula

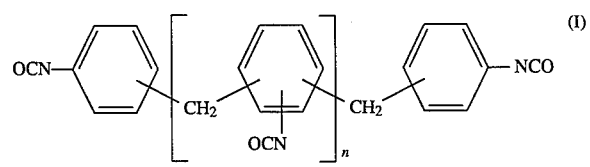

(I)

wherein is from 0 to 10 with the proviso the polyisocyanate mixture contains less than 25% by weight of diphenylmethane diisocyanate where n=0, less than 5% by weight of diphenylmethane 2,4'-diisocyanate and has a viscosity of from 2500 to 8000 mPa.s at 35° C.

2. A composition as claimed in claim 1, wherein the mixture of polyisocyanates contains from 5 to 20% of diphenylmethane diisocyanates.

3. A composition as claimed in claim 1, wherein the mixture of polyisocyanates contains less than 5% of diphenylmethane 2,4'-diisocyanate.

4. A composition as claimed in claim 1, wherein the mixture of polyisocyanates has a viscosity at 25° C. within the range from 1500 to 12,000 mPa.s.

5. A composition as claimed in claim 1, wherein the polyisocyanates have been blocked with an alcohol, an amine or an oxime or a mixture thereof.

6. A composition as claimed in claim 5, wherein the polyisocyanates have been blocked with a diethylene glycol monobutyl ether, dibutylamine, methyl ethyl ketoxime, diallylamine or a mixture thereof.

7. An aqueous dispersion comprising a composition as claimed in claim 1 and if desired, additionally, pigments, fillers, corrosion inhibitors, customary coating assistants and/or solvents.

8. The composition of claim 1 wherein the viscosity of the polyisocyanate mixture is from 3,500 to 6,000 mPa.s at 35° C.

9. In a method of cathodic electrocoating a conductive surface wherein a coating composition is in contact with that surface and deposition voltage is applied causing the surface to be coated by the coating composition, the improvement wherein the coating composition is the composition of claim 1.

10. The electrocoating method of claim 9 wherein the surface is that of phosphatized steel panel.

11. A coated article resulting from the method of claim 9.

12. A coated article resulting from the method of claim 10.

* * * * *

UNITED STATES PATENT AND TRADEMARK OFFICE
CERTIFICATE OF CORRECTION

PATENT NO.: 5,461,091

DATED: October 24, 1995

INVENTOR(S): HOFFMANN et al.

It is certified that error appears in the above-identified patent and that said Letters Patent is hereby corrected as shown below:

On the first page, item [63], "Ser. No. 962,886" should be --Ser. No. 962,826--.

Signed and Sealed this

Thirteenth Day of February, 1996

Attest:

BRUCE LEHMAN

Attesting Officer     Commissioner of Patents and Trademarks